United States Patent
Li et al.

(10) Patent No.: US 8,072,763 B2
(45) Date of Patent: Dec. 6, 2011

(54) PRINTED CIRCUIT BOARD ASSEMBLY

(75) Inventors: Yang Li, Shenzhen (CN); Hong-Zhi Sun, Shenzhen (CN); Shuang Fu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 51 days.

(21) Appl. No.: 12/728,587

(22) Filed: Mar. 22, 2010

(65) Prior Publication Data

US 2011/0096502 A1   Apr. 28, 2011

(30) Foreign Application Priority Data

Oct. 27, 2009   (CN) .......................... 2009 2 0313363

(51) Int. Cl.
*H05K 7/20* (2006.01)
*G06F 1/20* (2006.01)

(52) U.S. Cl. .............. 361/719; 361/679.47; 361/679.52; 361/679.54; 361/700; 361/704; 361/709; 165/80.3; 165/185; 174/15.2; 174/16.3

(58) Field of Classification Search .......... 361/679.46–679.47, 679.52, 679.54, 361/690, 699–700, 704, 709–710, 719; 165/80.2–80.3, 185; 174/15.2, 16.3

See application file for complete search history.

(56) References Cited

U.S. PATENT DOCUMENTS

| 6,937,474 | B2 * | 8/2005 | Lee ................................ | 361/715 |
| 7,019,974 | B2 * | 3/2006 | Lee et al. ....................... | 361/700 |
| 7,209,356 | B2 * | 4/2007 | Lee et al. ....................... | 361/719 |
| 7,327,576 | B2 * | 2/2008 | Lee et al. ....................... | 361/719 |
| 7,492,596 | B1 * | 2/2009 | Peng et al. ..................... | 361/700 |
| 7,511,947 | B2 * | 3/2009 | Leng et al. ............... | 361/679.52 |
| 2007/0008702 | A1 * | 1/2007 | Chang et al. .................. | 361/704 |
| 2008/0007914 | A1 * | 1/2008 | Peng et al. ..................... | 361/700 |
| 2008/0074846 | A1 * | 3/2008 | Peng et al. ..................... | 361/715 |
| 2008/0123295 | A1 * | 5/2008 | Wu et al. ....................... | 361/697 |
| 2008/0123296 | A1 * | 5/2008 | Chen et al. .................... | 361/700 |
| 2009/0194260 | A1 * | 8/2009 | Liao et al. ................ | 165/104.33 |
| 2009/0279262 | A1 * | 11/2009 | Huang et al. .................. | 361/704 |

FOREIGN PATENT DOCUMENTS

DE   202006008870 U1 * 11/2006

* cited by examiner

*Primary Examiner* — Robert J Hoffberg
(74) *Attorney, Agent, or Firm* — Altis Law Group, Inc.

(57) ABSTRACT

A printed circuit board assembly includes a heat sink, a back board, and a securing member. The heat sink is configured to be mounted on a heat generating element of a printed circuit board. The heat sink is configured to dissipate heat generated by the heat generating element. The heat sink and the back board are configured to be placed on opposite sides of the printed circuit board. The heat sink includes a first connecting heat pipe. The back board includes a second connecting heat pipe. The second connecting heat pipe contacts the first connecting heat pipe. The securing member thermally contacts the first connecting heat pipe and the second connecting heat pipe.

16 Claims, 3 Drawing Sheets

PRINTED CIRCUIT BOARD ASSEMBLY

BACKGROUND

1. Technical Field

The disclosure generally relates to printed circuit board (PCB) assemblies, especially to a PCB having a heat dissipating module.

2. Description of Related Art

There are many components that can be mounted on a PCB, such as a south bridge, a north bridge, and an integrated circuit (IC). Electronic components, such as central processing units (CPUs), in computers generate a lot of heat that can affect operation and may cause damage if the heat is not removed from the electronic devices efficiently.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
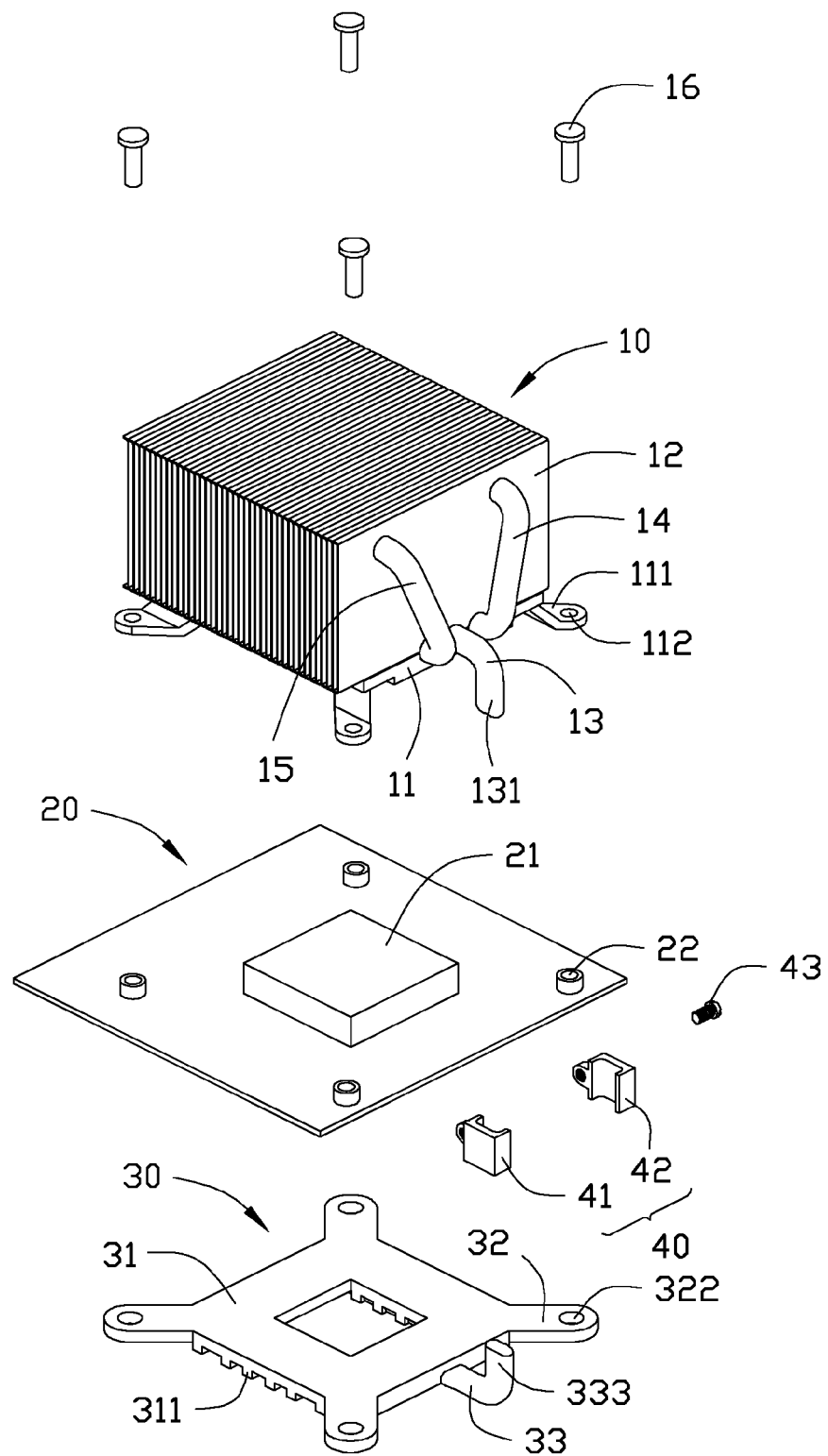
FIG. 1 is an exploded, isometric view of an embodiment of a printed circuit board assembly.
Figure 2:
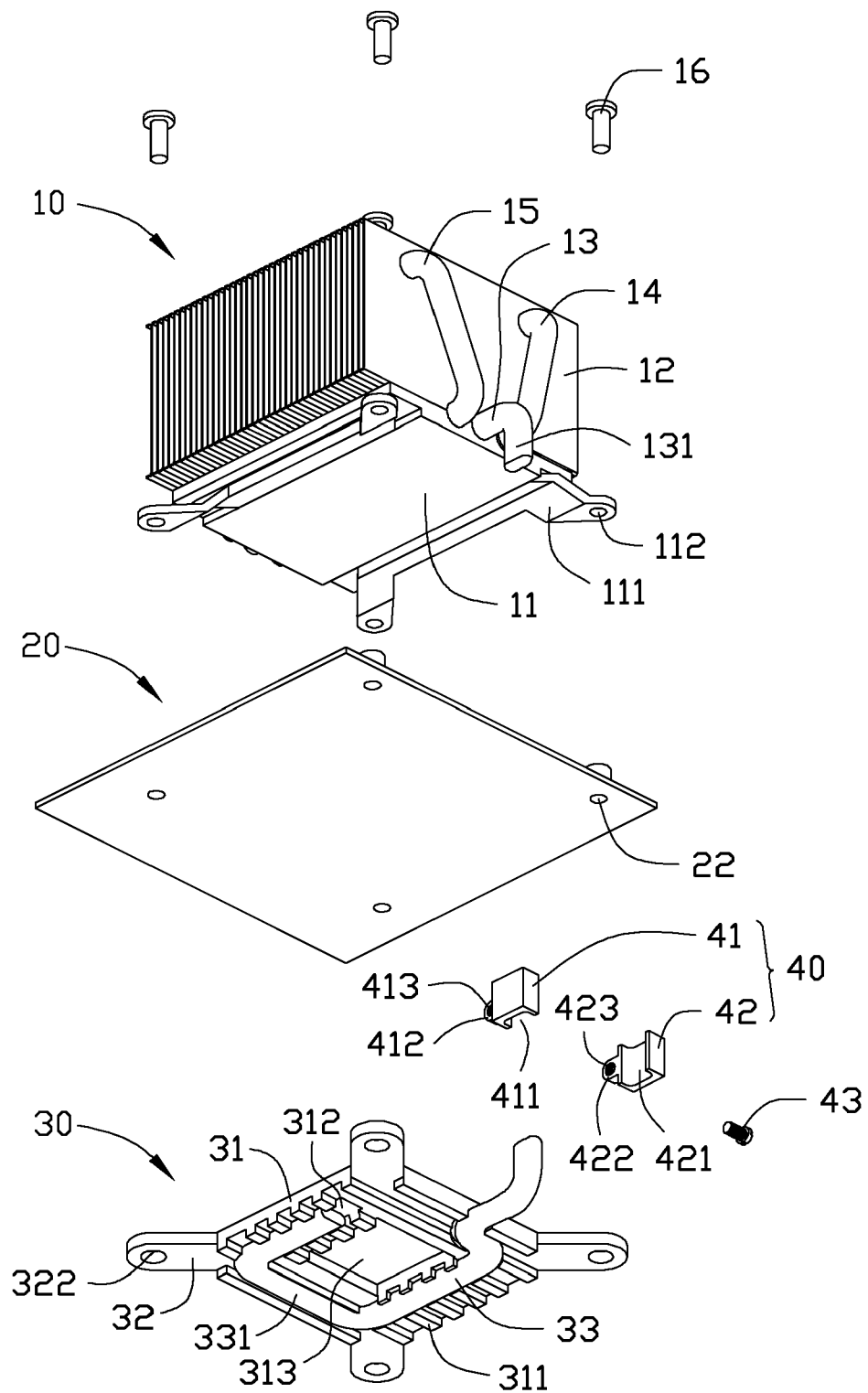
FIG. 2 is similar to FIG. 1, but viewed from another aspect.

Referring to FIGS. 1 and 2, a printed circuit board (PCB) assembly includes a heat sink 10, a PCB 20, and a back board 30.

The heat sink 10 includes a base 11, a plurality of fins 12 extending from the base 11, a first connecting heat pipe 13, and two heat pipes 14, 15. The first connecting heat pipe 13 is embedded in the base 11. The first connecting heat pipe 13 includes a first connecting portion 131 extending downwardly from a distal end of the first connecting heat pipe 13. The two heat pipes 14, 15 are embedded in the base 11 and the fins 12. The first connecting heat pipe 13 is disposed between the two heat pipes 14, 15. The base 11 includes a mounting portion 111 at each of four corners of the base 11. Each mounting portion 111 defines a mounting hole 112.

A heat generating element 21 is mounted to the PCB 20. The PCB 20 can define four through holes 22 surrounding the heat generating element 21. The through holes 22 correspond to the mounting holes of the heat sink 10 respectively. In one embodiment, the heat generating element 21 is a central processing unit (CPU).

The back board 30 includes a main body 31, four securing portions 32 extending from the main body 31, and a second connecting heat pipe 33. Each securing portion 32 defines a securing hole 322 to align with a corresponding through hole 22 of the PCB 20. The second connecting heat pipe 33 includes a heat pipe body 331 and a second connecting portion 333 extending upwardly from the heat pipe body 331. The second connecting portion 333 corresponds with the first connecting portion 131. The main body 31 includes a groove 312 embedded in and surrounding an aperture 313 of the main body 31. The heat pipe body 331 is embedded into the groove 312 of the main body 31. A plurality of back board fins 311 extends from the main body 31.

A securing member 40 is configured to secure the first connecting heat pipe 13 and the second connecting heat pipe 33 together. The securing member 40 includes a first receiving portion 41 and a second receiving portion 42. The first receiving portion 41 has a first recess 411 and a first securing portion 412. The first securing portion 412 defines a securing hole 413. The second receiving portion 42 has a second recess 421 and a second securing portion 422. The second securing portion 422 defines a securing hole 423.

Figure 3:
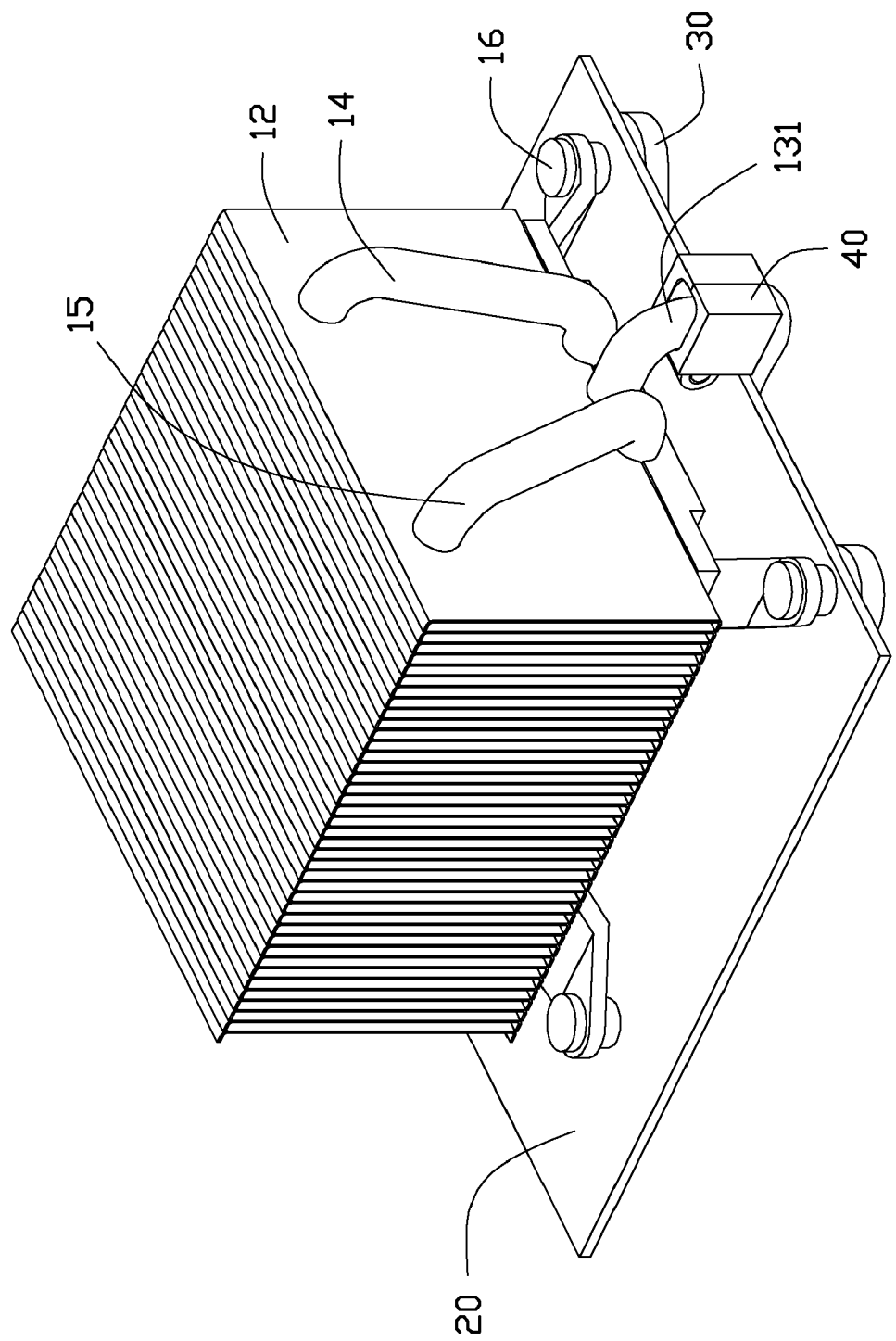
FIG. 3 is an assembled view of FIG. 1.

Referring to FIGS. 1 to 3, in assembly, the mounting holes 112 are aligned with the through holes 22 of the PCB 20 and the securing holes 322 of the back board 30 respectively. Four fasteners 16 are respectively extended through the mounting holes 112 and the through holes 22 and screwed into the securing holes 322 to secure the heat sink 10, the PCB 20, and the back board 30 together. At this time, the back board 30 and the heat sink abut on two opposite sides of the PCB 20. The back board 30 supports the PCB 20 to enhance structural integrity of the PCB 20. The first connecting portion 131 of the first connecting heat pipe 13 contacts the second connecting portion 333 of the connecting heat pipe 33. The first recess 411 of the first receiving portion 41 and the second recess 421 of the second receiving portion 42 receive both the first connecting portion 131 and the second connecting portion 333. The securing hole 413 is aligned with the securing hole 423. A fastener 43 is screwed into the securing hole 413 and the securing hole 423 to secure the first connecting portion 131 to the second connecting portion 333.

In one embodiment, a layer of heat-conduction medium is disposed between the first connecting portion 131 and the second connecting portion 333.

Heat generated from the heat generating element 21 is delivered from the heat sink 10 to the back board 30. The back board 30 dissipates heat for the heat generating element 21, thereby enhancing heat dissipation efficiency of the printed circuit board assembly.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board assembly, comprising:
   a printed circuit board, the printed circuit board defining a upper surface and lower surface, a heat generating element disposed on the upper surface;
   a heat sink mounted on the heat generating element, the heat sink configured to dissipate heat generated by the heat generating element, the heat sink comprising a first connecting heat pipe;
   a back board disposed on the lower surface, the back board comprising
      a second connecting heat pipe, the second connecting heat pipe contacting the first connecting heat pipe,
      an aperture in the backboard, and
      a groove embedded in and surrounding the aperture of the backboard; and
   a securing member thermally contacting the first connecting heat pipe and the second connecting heat pipe,
   wherein the second connecting heat pipe is embedded in the groove of the backboard.

2. The printed circuit board assembly of claim 1, wherein the heat sink comprises a base contacting the heat generating element, the first connecting heat pipe is connected to the base, the first connecting heat pipe comprises a first connecting portion, the second connecting heat pipe comprises a heat pipe body and a second connecting portion extending upwardly from the heat pipe body, and the first connecting portion is in contact with the second connecting portion.

3. The printed circuit board assembly of claim 2, wherein the securing member comprises a first receiving portion and a second receiving portion, the first receiving portion having a first recess, and the second receiving portion having a second recess; the first recess and the second recess receive both the first connecting portion and the second connecting portion.

4. The printed circuit board assembly of claim 3, wherein the first receiving portion comprises a first securing portion, and the second receiving portion comprises a second securing portion; the first securing portion comprising a first securing hole, and the second securing portion comprising a second securing hole corresponding to the first securing hole.

5. The printed circuit board assembly of claim 2, wherein the heat sink further comprises a mounting portion extending from the base, and the mounting portion defines a mounting hole; the printed circuit board defines a through hole corresponding to the mounting hole; and the back board defines a securing hole corresponding to the mounting hole.

6. The printed circuit board assembly of claim 2, wherein the heat sink further comprises a plurality of fins extending from the base and a third heat pipe, one end of the third heat pipe is embedded in the base, and another end of the third heat pipe is embedded in the plurality of fins.

7. The printed circuit board assembly of claim 2, wherein a layer of heat-conduction medium is disposed between the first connecting portion and the second connecting portion.

8. The printed circuit board assembly of claim 1, wherein the back board comprises a plurality of back board fins.

9. A heat dissipating module, comprising:
a heat sink, the heat sink comprising a base and a first connecting heat pipe embedded in the base;
a back board, the back board comprising
a second connecting heat pipe, the second connecting heat pipe is in contact with the first connecting heat pipe,
an aperture in the backboard, and
a groove embedded in and surrounding the aperture of the backboard; and
a securing member thermally contacting the first connecting heat pipe and the second connecting heat pipe;
wherein the heat sink, and the back board are secured together via a plurality of fasteners, and
the second connecting heat pipe is embedded in the groove of the backboard.

10. The heat dissipating module of claim 9, wherein the first connecting heat pipe comprises a first connecting portion, the second connecting heat pipe comprises a heat pipe body and a second connecting portion extending upwardly from the heat pipe body, and the first connecting portion is in contact with the second connecting portion.

11. The heat dissipating module of claim 10, wherein the securing member comprises a first receiving portion and a second receiving portion, the first receiving portion having a first recess, and the second receiving portion having a second recess; the first recess and the second recess receiving both the first connecting portion and the second connecting portion.

12. The heat dissipating module of claim 11, wherein the first receiving portion comprises a first securing portion, and the second receiving portion comprises a second securing portion; the first securing portion comprising a first securing hole; and the second securing portion comprising a second securing hole corresponding to the first securing hole.

13. The heat dissipating module of claim 10, wherein a layer of heat-conduction medium is disposed between the first connecting portion and the second connecting portion.

14. The heat dissipating module of claim 9, wherein the heat sink defines a plurality of mounting holes, and the back board defines a plurality of securing holes corresponding to the plurality of mounting holes.

15. The heat dissipating module of claim 9, wherein the heat sink further comprises a plurality of fins extending from the base and a third heat pipe; one end of the third heat pipe is embedded in the base, and another end of the third heat pipe is embedded in the plurality of fins.

16. The heat dissipating module of claim 9, wherein the back board comprises a plurality of back board fins.

* * * * *